(12) United States Patent
Fujieda et al.

(10) Patent No.: US 8,392,347 B2
(45) Date of Patent: Mar. 5, 2013

(54) COATING COLOR DATABASE CREATING METHOD, SEARCH METHOD USING THE DATABASE, THEIR SYSTEM, PROGRAM, AND RECORDING MEDIUM

(75) Inventors: Tsukasa Fujieda, Hiratsuka (JP); Keisuke Sai, Hiratsuka (JP); Yutaka Masuda, Hiratsuka (JP)

(73) Assignee: Kansai Paint Co., Ltd., Hyogo (JP)

(*) Notice: Subject to any disclaimer, the term of this patent is extended or adjusted under 35 U.S.C. 154(b) by 590 days.

(21) Appl. No.: 12/663,364

(22) PCT Filed: Jun. 19, 2008

(86) PCT No.: PCT/JP2008/061254
§ 371 (c)(1),
(2), (4) Date: Jan. 19, 2010

(87) PCT Pub. No.: WO2008/156147
PCT Pub. Date: Dec. 24, 2008

(65) Prior Publication Data
US 2010/0169255 A1    Jul. 1, 2010

(30) Foreign Application Priority Data

Jun. 20, 2007 (JP) ................................. 2007-162509

(51) Int. Cl.
*G06F 15/18* (2006.01)
*C23C 16/52* (2006.01)
(52) U.S. Cl. ............................................. 706/25; 427/8
(58) Field of Classification Search ........................ None
See application file for complete search history.

(56) References Cited

U.S. PATENT DOCUMENTS

| | | | |
|---|---|---|---|
| 5,386,496 A | 1/1995 | Arai et al. | |
| 5,559,604 A | 9/1996 | Arai | |

(Continued)

FOREIGN PATENT DOCUMENTS

| | | |
|---|---|---|
| CN | 1102897 | 5/1995 |
| JP | 4-261267 | 9/1992 |

(Continued)

OTHER PUBLICATIONS

International Search Report issued Sep. 22, 2008 in International (PCT) Application No. PCT/JP2008/061254.

(Continued)

*Primary Examiner* — Alan Chen
(74) *Attorney, Agent, or Firm* — Wenderoth, Lind & Ponack, L.L.P.

(57) ABSTRACT

The subject invention provides a method of creating a database for searching for a paint color having a desired texture, a search method using the database, and systems, programs, and recording mediums for carrying out the method and the search. The method for creating a database includes a step (S11) for storing spectral reflectance data and micro-brilliance data of a plurality of paint colors after associating each spectral reflectance data and each micro-brilliance data with a paint color code; a step (S13) for storing texture evaluation values of sample paint colors after associating the each texture evaluation value with the paint color code; a step (S14) for calculating characteristic quantities of the paint colors expressing textures using the spectral reflectance data and the micro-brilliance data, and storing the characteristic quantities after associating the each characteristic quantity with the paint color code; a step (S15) for carrying out a process for training a neural network using the characteristic quantities and the texture evaluation values of the sample paint colors as training data; and a step (S16) for inputting characteristic quantities of the paint colors other than the sample paint colors into the neural network after the training process, and storing output data after associating the each output data with the paint color code.

8 Claims, 6 Drawing Sheets

U.S. PATENT DOCUMENTS

| | | | |
|---|---|---|---|
| 5,590,251 A * | 12/1996 | Takagi | 345/604 |
| 5,717,605 A | 2/1998 | Komiya et al. | |
| 5,911,138 A | 6/1999 | Li et al. | |
| 2001/0036309 A1 | 11/2001 | Hirayama et al. | |
| 2002/0184168 A1 | 12/2002 | McClanahan et al. | |
| 2002/0184171 A1 * | 12/2002 | McClanahan | 706/20 |
| 2003/0078688 A1 | 4/2003 | Sarabi | |
| 2007/0003691 A1 * | 1/2007 | Rodrigues et al. | 427/140 |

FOREIGN PATENT DOCUMENTS

| | | |
|---|---|---|
| JP | 7-95425 | 4/1995 |
| JP | 7-120324 | 5/1995 |
| JP | 7-150081 | 6/1995 |
| JP | 8-94442 | 4/1996 |
| JP | 11-211569 | 8/1999 |
| JP | 2000-331076 | 11/2000 |
| JP | 2003-279413 | 10/2003 |
| JP | 2003-322565 | 11/2003 |
| JP | 2006-284601 | 10/2006 |
| WO | 2006/030028 | 3/2006 |

OTHER PUBLICATIONS

Daniel Dupont "Study of the Reconstruction of Reflectance Curves Based on Tristimulus Values: Comparison of Methods of Optimization", Color Research and Application, Apr. 2002, vol. 27, No. 2, pp. 88-99.

Touru Hirayama et al., "Visual Evaluation and Digital Image Analysis of "Micro-brilliance"—(II)", Research on Coatings, Kansai Paint Co., Ltd., No. 138, Jul. 2002, pp. 8-24.

Eiji Nomura et al., "Visual Evaluation and Digital Image Analysis of "Micro-brilliance"", Research on Coatings, Kansai Paint Co., Ltd., No. 132, Apr. 1999, pp. 22-35.

Supplementary European Search Report issued Mar. 30, 2012 in corresponding European Patent Application No. 08765757.

M.R. McLellan et al., "Hue Angle Determinations and Statistical Analysis for Multiquadrant Hunter L,a,b Data", Journal of Food Quality, No. 18, Jan. 1, 1995, pp. 235-240.

* cited by examiner output layer 10 units (impression terms)

intermediate
layer
30 units input layer 26 units
(characteristic quantities expressing textures)

COATING COLOR DATABASE CREATING METHOD, SEARCH METHOD USING THE DATABASE, THEIR SYSTEM, PROGRAM, AND RECORDING MEDIUM

TECHNICAL FIELD

The present invention relates to a paint color database. More specifically, the present invention relates to a method of creating a database for searching for a paint color having a desired texture or a paint color that belongs to a desired color category, a search method using the database, and a system, a program, and a recording medium therefor.

BACKGROUND ART

With regard to industrial products such as vehicles, the color is significant in terms of the marketability. Generally, during the process of developing and designing industrial products such as vehicles, colors are designed based on the function and concept of the products.

When coloring is done by applying paint, colors obtained by application are called "paint colors". Usually, when designing colors, a color designer of a product (hereinafter referred to as a "user") tells a paint manufacturer the texture desired for a paint color, and asks the paint manufacturer to develop the paint color accordingly. The "texture" of a paint color denotes the impression received by an observer when looking at the paint color, as well as the impression given by the paint color. The paint manufacturer's engineer designs a paint color in view of the texture desired by the user. The user evaluates the paint color designed by the paint manufacturer, and may request that the paint color be modified such that the paint color matches the desired texture; the paint manufacturer's engineer then redesigns the paint color according to the request. Such a cycle is repeated between the user and the paint manufacturer's engineer to complete the paint color desired by the user.

During the first stage of the paint color design cycle described above, the paint manufacturer's engineer understands the texture that the user desires for the paint color, then searches for a paint color that matches the texture desired by the user among numerous paint colors that have been designed (hereinafter referred to as stock colors), and then presents the paint color obtained through the search to the user for evaluation. At this time, if the paint color presented to the user by the paint manufacturer is greatly different from the texture desired by the user, the design process of the paint color must be started over from the first stage of the above-described cycle, resulting in a large number of industrial steps required for designing a paint color.

Usually, when designing a paint color, the texture desired by the user is conveyed to the paint manufacturer's engineer by terms expressing textures such as translucent appearance, deepness appearance, three-dimensional appearance, etc. (hereinafter these words are referred to as "impression terms"). However, because the impression that one receives from these impression terms varies depending on the individual, the texture desired by the user is often not accurately conveyed to the paint manufacturer's engineer.

There have been attempts to quantify the textures expressed by the impression terms. For example, Patent Document 1 below discloses a method of quantifying the textures of metallic paint colors, such as metallic appearance, clearness appearance, etc., based on evaluation values obtained from colorimetric values of the paint colors using a specific function.

Patent Document 1: Japanese Unexamined Patent Publication No. 2003-279413
Patent Document 2: Japanese Unexamined Patent Publication No. H11-211569
Non-Patent Document 1: Touru HIRAYAMA, Shin YAMANAGA, Shinichi GAMOU, "Visual Evaluation and Digital Image Analysis of Micro-brilliance (II)", Research on Coatings, Kansai Paint Co., Ltd., No. 138, July 2002
Non-Patent Document 2: Eiji NOMURA, Touru HIRAYAMA "Visual Evaluation and Digital Image Analysis of Micro-brilliance", Research on Coatings, Kansai Paint Co., Ltd., No. 132, April 1999

DISCLOSURE OF THE INVENTION

Problem to be Solved by the Invention

However, there is a problem with the method described in Patent Document 1. That is, although the method quantifies specific textures of metallic paint colors so that the quantified values can be used for comparison, the textures subjected to quantification are limited to those of metallic paint colors, such as metallic appearance, clearness appearance, and the like.

Further, the method described in Patent Document 1 has another problem. That is, the method can only be used when the colorimetric values (explanatory variables) and the textures (response variables) used for multiple linear regression analysis have a linear relationship. When the colorimetric values and the textures have a nonlinear relationship and/or when each of the colorimetric values is correlated with each other, the textures cannot be accurately quantified.

The present invention is achieved to solve the above problems. The object is to provide a method of creating a database for determining a paint color having a desired texture or a paint color that belongs to a desired color category, a search method using the database, and a system, a program, and a recording medium therefor.

Means for Solving the Problem

In order to solve the foregoing problem, a first method for creating a paint color database according to the present invention comprises: a first step of storing spectral reflectance data and micro-brilliance data expressing particle feeling of a plurality of paint colors in a recording unit after associating each spectral reflectance data and each micro-brilliance data with a code for specifying each paint color; a second step of storing texture evaluation values of sample paint colors selected from the plurality of paint colors in the recording unit after associating the each texture evaluation value with the code; a third step of calculating characteristic quantities of the paint colors expressing textures using the spectral reflectance data and the micro-brilliance data, and storing the characteristic quantities in the recording unit after associating the each characteristic quantity with the code; a fourth step of carrying out a process for training a neural network having input units corresponding to the characteristic quantities and output units corresponding to the texture evaluation values, using the characteristic quantities and the texture evaluation values of the sample paint colors as training data; and a fifth step of inputting characteristic quantities of the paint colors other than the sample paint colors into the neural network after the training process, and storing output data in the recording unit after associating the each output data with the code.

In addition to the feature of the first method, the second method for creating a paint color database according to the present invention is further arranged so that the first step comprises a step of obtaining image data of each paint color using an imaging device and calculating micro-brilliance data from the image data, the micro-brilliance data are HG, HB, HBL and SB,
the HG has a condition such that:
in cases where IPSL≧0.32: HG=500·IPSL−142.5
in cases where 0.32>IPSL≧0.15: HG=102.9·IPSL−15.4
in cases where 0.15>IPSL: HG=0
the HB has a condition such that:

$$HB=(BV-50)/2$$

the HBL is an HB found from the image data taken under a condition where GL=14, and the SB is an HG found from the image data taken under a condition where GL=125, wherein GL represents an average gray level of image data, V and A respectively represent gross luminance volume and gross luminance area greater than a threshold="GL+32" binarized by the threshold, L represents an average particle diameter binarized by a threshold="GL+24", PHav and PSav respectively represent an average peak height and an average peak skirt of luminance image that satisfy: PHav=3V/A, PSav=L/PHav and BV=PHav+350 PSav, IPSL satisfies:

$$IPSL=\int_0^N\int_0^{2\pi}P(\nu,\theta)d\nu d\theta/P(0,0)$$

wherein $\nu$ represents spatial frequency, $\theta$ represents angle, $P(\nu,\theta)$ represents power spectrum found from the image data, and 0 to N are spatial frequency regions for the particle feeling.

In addition to the feature of the first method, the third method for creating a paint color database according to the present invention is further arranged so that the characteristic quantities include: a characteristic quantity $L^*_{15}$, a characteristic quantity $a^*_{15}$, and a characteristic quantity $b^*_{15}$, which are $L^*$ value, $a^*$ value, and $b^*$ value calculated from a spectral reflectance at an observation angle of 15° in the $L^*a^*b^*$ color space, a characteristic quantity $L^*_{45}$, a characteristic quantity $a^*_{45}$, and a characteristic quantity $b^*_{45}$, which are $L^*$ value, $a^*$ value, and $b^*$ value calculated from a spectral reflectance at an observation angle of 45° in the $L^*a^*b^*$ color space, a characteristic quantity $L^*_{75}$, a characteristic quantity $a^*_{75}$, and a characteristic quantity $b^*_{75}$, which are $L^*$ value, $a^*$ value, and $b^*$ value calculated from a spectral reflectance at an observation angle of 75° in the $L^*a^*b^*$ color space; a characteristic quantity FF(15,25), a characteristic quantity FF(25,45), a characteristic quantity FF(45,75) a characteristic quantity FF(75,110) and a characteristic quantity FF(15, 45), which are found according to $2\times(Y_{15}-Y_{25})/(Y_{15}+Y_{25})$, $2\times(Y_{25}-Y_{45})/(Y_{25}+Y_{45})$, $2\times(Y_{45}-Y_{75})/(Y_{45}+Y_{75})$, $2\times(Y_{75}-Y_{110})/(Y_{75}+Y_{110})$, and $2\times(Y_{15}-Y_{45})/(Y_{15}+Y_{45})$, respectively, wherein $Y_{15}$ represents a Y value calculated from a spectral reflectance at an observation angle of 15° in the XYZ color space, $Y_{25}$ represents a Y value calculated from a spectral reflectance at an observation angle of 25° in the XYZ color space, $Y_{45}$ represents a Y value calculated from a spectral reflectance at an observation angle of 45° in the XYZ color space, $Y_{75}$ represents a Y value calculated from a spectral reflectance at an observation angle of 75° in the XYZ color space, $Y_{110}$ represents a Y value calculated from a spectral reflectance at an observation angle of 110° in the XYZ color space; a characteristic quantity $c^*_{15}$ that is a $c^*$ value calculated from a spectral reflectance at an observation angle of 15° in the $L^*C^*h^*$ color space, a characteristic quantity $c^*_{45}$ that is a $c^*$ value calculated from a spectral reflectance at an observation angle of 45° in the $L^*C^*h^*$ color space, and a characteristic quantity $c^*_{75}$ that is a $c^*$ value calculated from a spectral reflectance at an observation angle of 75° in the $L^*C^*h^*$ color space; a characteristic quantity cFF(15,25) that is found according to $2\times(c^*_{15}-c^*_{25})/(c^*_{15}+c^*_{25})$, a characteristic quantity cFF(25, 45) that is found according to $2\times(c^*_{25}-c^*_{45})/(c^*_{25}+c^*_{45})$, a characteristic quantity cFF(45, 75) that is found according to $2\times(c^*_{45}-c^*_{75})/(c^*_{45}+c^*_{75})$, a characteristic quantity cFF(75,110) that is found according to $2\times(c^*_{75}-c^*_{110})/(c^*_{75}-c^*_{110})$ and a characteristic quantity cFF(15,45) that is found according to $2\times(c^*_{15}-c^*_{45})/(c^*_{15}-c^*_{45})$ wherein $c^*_{25}$ represents a $c^*$ value calculated from a spectral reflectance at an observation angle of 25° in the $L^*C^*h^*$ color space, and $c^*_{110}$ represents a $c^*$ value calculated from a spectral reflectance at an observation angle of 110° in the $L^*C^*h^*$ color space; and characteristic quantities HG, HB, HBL and SB which are the micro-brilliance data.

A fourth method for creating a paint color database according to the present invention comprises: a first step of storing spectral reflectance data of a plurality of paint colors in a recording unit after associating each spectral reflectance data with a code for specifying each paint color; a second step of storing color category evaluation values of sample paint colors selected from the plurality of paint colors in the recording unit after associating the each color category evaluation value with the code; a third step of calculating characteristic quantities of the paint colors expressing color categories using the spectral reflectance data, and storing the characteristic quantities in the recording unit after associating the each characteristic quantity with the code; a fourth step of carrying out a process for training a neural network having input units corresponding to the characteristic quantities and output units corresponding to the color category evaluation values, using the characteristic quantities and the color category evaluation values of the sample paint colors as training data; and a fifth step of inputting characteristic quantities of the paint colors other than the sample paint colors into the neural network after the training process, and storing output data in the recording unit after associating the each output data with the code.

In addition to the feature of the fourth method, the fifth method for creating a paint color database according to the present invention is further arranged so that the characteristic quantities include: a characteristic quantity $L^*_{15}$, a characteristic quantity $a^*_{15}$, and a characteristic quantity $b^*_{15}$, which are $L^*$ value, $a^*$ value, and $b^*$ value calculated from a spectral reflectance at an observation angle of 15° in the $L^*a^*b^*$ color space, a characteristic quantity $L^*_{45}$, a characteristic quantity $a^*_{45}$, and a characteristic quantity $b^*_{45}$, which are $L^*$ value, $a^*$ value, and $b^*$ value calculated from a spectral reflectance at an observation angle of 45° in the $L^*a^*b^*$ color space, a characteristic quantity $L^*_{110}$, a characteristic quantity $a^*_{110}$, and a characteristic quantity $b^*_{110}$, which are $L^*$ value, $a^*$ value, and $b^*$ value calculated from a spectral reflectance at an observation angle of 110° in the $L^*a^*b^*$ color space; a characteristic quantity $c^*_{15}$ that is a $c^*$ value calculated from a spectral reflectance at an observation angle of 15° in the $L^*C^*h^*$ color space, a characteristic quantity $c^*_{45}$ that is a $c^*$ value calculated from a spectral reflectance at an observation angle of 45° in the $L^*C^*h^*$ color space, and a characteristic quantity $c^*_{110}$ that is a $c^*$ value calculated from a spectral reflectance at an observation angle of 110° in the $L^*C^*h^*$ color space; a characteristic quantity $\sin(h_{15})$; a characteristic quantity $\cos(h_{15})$, a characteristic quantity $\sin(h_{45})$, a characteristic quantity $\cos(h_{45})$, a characteristic quantity $\sin(h_{110})$ and a characteristic quantity $\cos(h_{110})$, wherein $h_{15}$ represents a hue angle at an observation angle of 15°, $h_{45}$ represents a hue angle at an observation angle of 45°, $h_{110}$ represents a hue angle at an observation angle of 110°, which are found from the $a^*_{15}$, $b^*_{15}$, $a^*_{45}$, $b^*_{45}$, $a^*_{110}$, and $b^*_{110}$ according to $h=\tan^{-1}(b^*/a^*)$; and a characteristic quantity FF(15,45), which is found according to $2\times(Y_{15}-Y_{45})(Y_{15}+Y_{45})$, wherein $Y_{15}$ represents a Y value calculated from a spectral reflectance at an observation angle of 15° in the XYZ color space, and $Y_{45}$ represents a Y value calculated from a spectral reflectance at an observation angle of 45° in the XYZ color space.

A first method for searching for a paint color according to the present invention is a method for searching for a paint color in a paint color database created by the first method for creating a paint color database, comprising: a first step of receiving, as a search query, texture and an evaluation value that denotes a degree of presence of the texture; a second step of retrieving an evaluation value corresponding to the texture from the database, and determining whether the evaluation value is a value indicating the presence of the texture; and a third step of, if determining that the evaluation value is a value indicating the presence of the texture in the second step, giving a corresponding paint color code as a search result.

A second method for searching for a paint color according to the present invention is a method for searching for a paint color in a paint color database created by the fourth method for creating a paint color database, comprising: a first step of receiving, as a search query, a color category and an evaluation value that denotes a degree of attribution to the color category; a second step of retrieving an evaluation value corresponding to the color category from the database, and determining whether the evaluation value is a value indicating the attribution to the color category; and a third step of, if determining that the evaluation value is a value indicating the attribution to the color category in the second step, giving a corresponding paint color code as a search result.

A first system for creating a paint color database comprises: an arithmetic unit having a recording unit; a spectrophotometer; and an imaging device, wherein: the arithmetic unit measures spectral reflectance data for each of a plurality of paint colors using the spectrophotometer, the arithmetic unit obtains image data of the paint colors using the imaging device, and calculates micro-brilliance data expressing particle feeling of the paint colors from the image data, the arithmetic unit stores the spectral reflectance data and the micro-brilliance data of the paint colors in the recording unit after associating each spectral reflectance data and each micro-brilliance data with a code for specifying each paint color, the arithmetic unit stores texture evaluation values of sample paint colors selected from the paint colors in the recording unit after associating the each texture evaluation value with the code, the arithmetic unit calculates characteristic quantities of the paint colors expressing textures using the spectral reflectance data and the micro-brilliance data, and stores the characteristic quantities in the recording unit after associating the each characteristic quantity with the code, the arithmetic unit carries out a process for training a neural network having input units corresponding to the characteristic quantities and output units corresponding to the texture evaluation values, using the characteristic quantities and the texture evaluation values of the sample paint colors as training data; and the arithmetic unit inputs characteristic quantities of the paint colors other than the sample paint colors into the neural network after the training process, and stores output data in the recording unit after associating the each output data with the code.

A second system for creating a paint color database comprises: an arithmetic unit having a recording unit; and a spectrophotometer, wherein: the arithmetic unit measures spectral reflectance data for each of a plurality of paint colors using the spectrophotometer, the arithmetic unit stores the spectral reflectance data of the paint colors in the recording unit after associating each spectral reflectance data with a code for specifying each paint color, the arithmetic unit stores color category evaluation values of sample paint colors selected from the paint colors in the recording unit after associating the each color category evaluation value with the code, the arithmetic unit calculates characteristic quantities of the paint colors expressing color categories using the spectral reflectance data, and stores the characteristic quantities in the recording unit after associating the each characteristic quantity with the code, the arithmetic unit carries out a process for training a neural network having input units corresponding to the characteristic quantities and output units corresponding to the color category evaluation values, using the characteristic quantities and the color category evaluation values of the sample paint colors as training data; and the arithmetic unit inputs characteristic quantities of the paint colors other than the sample paint colors into the neural network after the training process, and stores output data in the recording unit after associating the each output data with the code.

A first system for searching for a paint color according to the present invention is a system for searching for a paint color in a paint color database created by the first method for creating a paint color database, comprising: an arithmetic unit having a recording unit storing the database, wherein: the arithmetic unit receives, as a search query, texture and an evaluation value that denotes a degree of presence of the texture, the arithmetic unit retrieves an evaluation value corresponding to the texture from the database, and determines whether the evaluation value is a value indicating the presence of the texture; and if determining that the evaluation value is a value indicating the presence of the texture in the second step, the arithmetic unit gives a corresponding paint color code as a search result.

A second system for searching for a paint color according to the present invention is a system for searching for a paint color in a paint color database created by the fourth method for creating a paint color database, comprising: an arithmetic unit having a recording unit storing the database, wherein: the arithmetic unit receives, as a search query, a color category and an evaluation value that denotes a degree of attribution to the color category, the arithmetic unit retrieves an evaluation value corresponding to the color category from the database, and determines whether the evaluation value is a value indicating the attribution to the color category; and if determining that the evaluation value is a value indicating the attribution to the color category in the second step, the arithmetic unit gives a corresponding paint color code as a search result.

A first program for creating a paint color database causes a computer to realize: a first function for storing spectral reflectance data and micro-brilliance data expressing particle feeling of a plurality of paint colors in a recording unit after associating each spectral reflectance data and each micro-brilliance data with a code for specifying each paint color; a second function for storing texture evaluation values of sample paint colors selected from the plurality of paint colors in the recording unit after associating the each texture evaluation value with the code; a third function for calculating characteristic quantities of the paint colors expressing textures using the spectral reflectance data and the micro-brilliance data, and storing the characteristic quantities in the recording unit after associating the each characteristic quantity with the code; a fourth function for carrying out a process for training a neural network having input units corresponding to the characteristic quantities and output units corresponding to the texture evaluation values, using the characteristic quantities and the texture evaluation values of the sample paint colors as training data; and a fifth function for inputting characteristic quantities of the paint colors other than the sample paint colors into the neural network after the training process, and storing output data in the recording unit after associating the each output data with the code.

A second program for creating a paint color database causes a computer to realize: a first function for storing spectral reflectance data of a plurality of paint colors in a recording unit after associating each spectral reflectance data with a code for specifying each paint color; a second function for storing color category evaluation values of sample paint colors selected from the plurality of paint colors in the recording unit after associating the each color category evaluation value with the code; a third function for calculating characteristic quantities of the paint colors expressing color categories using the spectral reflectance data, and storing the characteristic quantities in the recording unit after associating the each characteristic quantity with the code; a fourth function for carrying out a process for training a neural network having input units corresponding to the characteristic quantities and output units corresponding to the color category evaluation values, using the characteristic quantities and the color category evaluation values of the sample paint colors as training data; and a fifth function for inputting characteristic quantities of the paint colors other than the sample paint colors into the neural network after the training process, and storing output data in the recording unit after associating the each output data with the code.

A first program for searching for a paint color according to the present invention is a program for searching for a paint color in a paint color database created by the first method for creating a paint color database by causing a computer to realize: a first function of receiving, as a search query, texture and an evaluation value that denotes a degree of presence of the texture; a second function of retrieving an evaluation value corresponding to the texture from the database, and determining whether the evaluation value is a value indicating the presence of the texture; and a third function of, if determining that the evaluation value is a value indicating the presence of the texture in the second step, giving a corresponding paint color code as a search result.

A second program for searching for a paint color according to the present invention is a program for searching for a paint color in a paint color database created by the fourth method for creating a paint color database by causing a computer to realize: a first function of receiving, as a search query, a color category and an evaluation value that denotes a degree of attribution to the color category; a second function of retrieving an evaluation value corresponding to the color category from the database, and determining whether the evaluation value is a value indicating the attribution to the color category; and a third function of, if determining that the evaluation value is a value indicating the attribution to the color category in the second step, giving a corresponding paint color code as a search result.

A computer-readable recording medium according to the present invention stores the first program for creating a paint color database, the second program for creating a paint color database, the first program for searching for a paint color, or the second program for searching for a paint color.

Effects of the Invention

According to the present invention, textures of paint colors or color categories to which the paint colors belong are quantified using characteristic quantities obtained from specific colorimetric values, thereby enabling the creation of a database in which the textures or the color categories of the paint colors are associated with codes specific to each paint color (hereinafter referred to as "paint color codes").

Further, a paint color that matches a desired texture or a paint color that belongs to a desired color category can be searched for in the database by specifying, as the search query, the color category and/or the texture conveyed from the user when designing the paint color.

As for a metallic paint color whose appearance varies depending on the observation angle, it is critical which data observed at what angle should be used to categorize the color for matching an individual's color recognition. In this regard, according to the present invention, a metallic paint color that matches a desired texture can be searched for in a specific color category by specifying, as the search query, both the color category and the texture conveyed from the user when designing the paint color.

Further, a set of stock colors can be narrowed down with high accuracy to a paint color that matches a desired texture, or a paint color that belongs to a desired color category, thus reducing the number of industrial steps required for designing the paint color.

Figure 1:
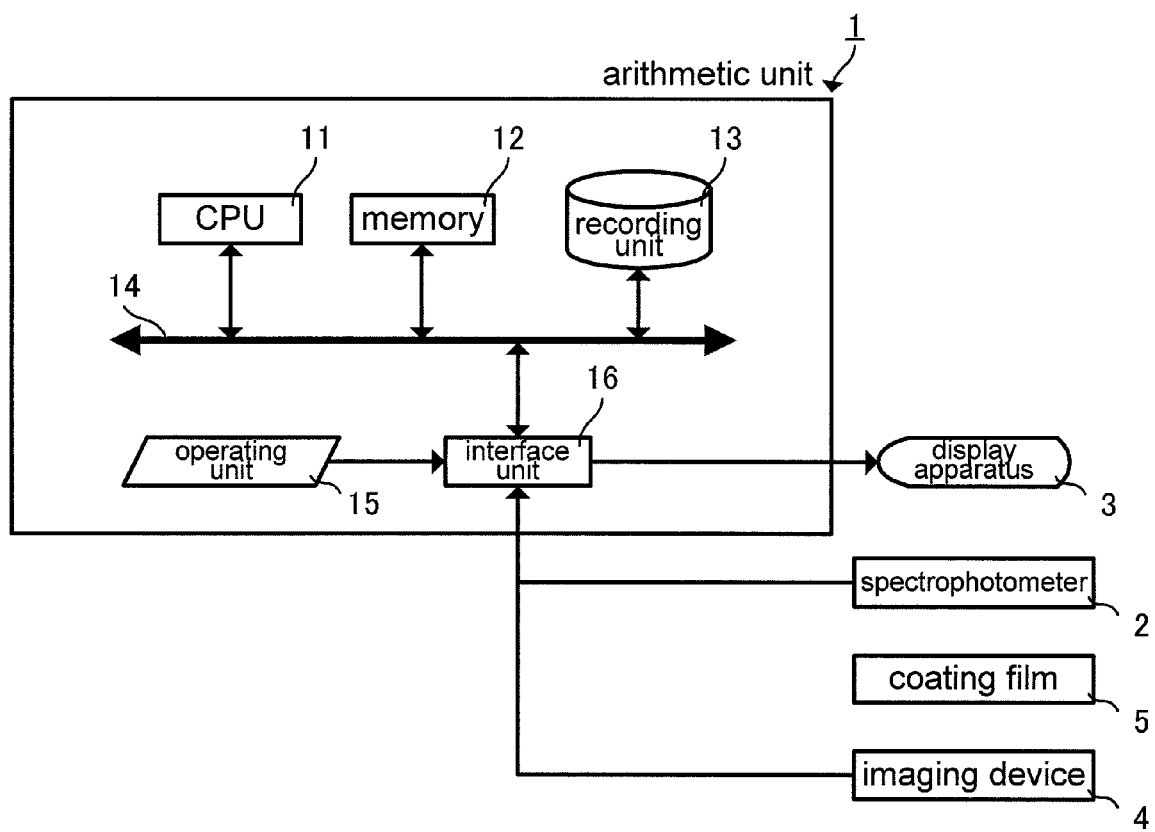
FIG. 1 A block diagram showing a schematic structure of a system for creating and searching a texture database according to a first embodiment of the present invention.

REFERENCE NUMERALS 1 arithmetic unit
2 spectrophotometer
3 display apparatus
4 imaging device
5 coating film
11 CPU
12 memory
13 recording unit
14 bus
15 operating unit
16 interface unit
51 entry field
52 paint color code
53 computer graphic image

BEST MODE FOR CARRYING OUT THE INVENTION

One embodiment of the present invention is described below in detail with reference to the attached figures.

In the present specification, "highlight" denotes the case of observing a paint color at an angle variation (an angle within the plane vertical to the surface of the coating film) from the specular reflection direction, i.e., at an angle of 10° to 25° from the specular reflection direction when the film coated with the paint color (coating film, hereinafter) is irradiated with light at 45° (an angle within the plane vertical to the surface of the coating film) with respect to its surface; "shade" denotes the case of observing a paint color at an angle of 75° to 110° from the specular reflection direction; and "face" denotes the case of observing a paint color at an angle between the highlight angle and the shade angle. Further, the micro-brilliance appearance denotes a texture expressed by the luster pigment in the coating film, which is perceivable in the microscopic observation.

The first embodiment of the present invention creates a database regarding textures (texture database, hereinafter) of paint colors, and carries out a search for a paint color that matches a desired texture from the created texture database.

FIG. 1 is a block diagram showing a schematic structure of a system for creating a texture database with which the search for a desired color is carried out. The system comprises an arithmetic unit 1, a spectrophotometer 2, a display apparatus 3 and an imaging device 4.

The arithmetic unit 1 includes: a CPU 11 configured to control the componential units of the system and execute the data processing described below; a memory 12; a recording unit 13 for storing the texture database described below; a bus 14 for carrying out data transmission between the componential units; an operating unit 15 for receiving external operations; and an interface unit (hereinafter referred to as an I/F unit) 16 for performing data input/output between the operating unit 15 and an external apparatus. The arithmetic unit 1 causes the spectrophotometer 2 to measure a spectral reflectance of the coating film 5, causes the imaging device 4 to take an image of the coating film 5, and obtains the spectral reflectance data and the image data via the I/F unit 16. The image display apparatus 3 is, for example, a display capable of full-color display. Via the I/F unit 16, the arithmetic unit 1 causes the image display apparatus 3 to display a search result of a desired paint color in a predetermined format, or display various kinds of information items obtained at each stage of the process. The imaging device 4 is, for example, a CCD camera.

The following schematically describes the first embodiment of the present invention. First, a plurality of spectral reflectance of the coating film 5 are measured for each stock color using the spectrophotometer 2, and image data of the coating film 5 is obtained using the imaging device 4 and various kinds of information items, such as spectral reflectances measured at plural observation angles, micro-brilliance appearance, formulation, material of the coating formulation, applying method of a test panel, computer graphic image, coating film performance, cost and the like (paint color-related information, hereinafter) is associated with each paint color code. The associated data sets are previously stored in the recording unit 13. Next, for each sample paint color, an evaluation value of the texture represented by an impression term, which is determined by an experienced designer, is associated with each paint color code. The associated data are stored in the recording unit 13. Then, characteristic quantities are calculated for the each stock color based on the spectral reflectance data and the micro-brilliance appearance data. Thereafter, a neural network is constructed using the characteristic quantities of the sample paint colors as an input unit and using the impression terms of the sample paint colors as an output unit; and the network is subjected to the training process, thereby determining weights of connection (synaptic weight data). Using the determined neural network, the texture evaluation values for the stock colors are found, and the obtained texture evaluation values are associated with the paint color codes when stored in the recording unit 13 as a texture database. When the value for specifying the presence of the texture expressed by an impression term is inputted, as a search query, from the operating unit 15, a search is carried out to find a paint color in the texture database that matches the search query; and the search results, i.e., a corresponding paint color code and paint color-related information, are displayed in the display apparatus 3.

Figure 2:
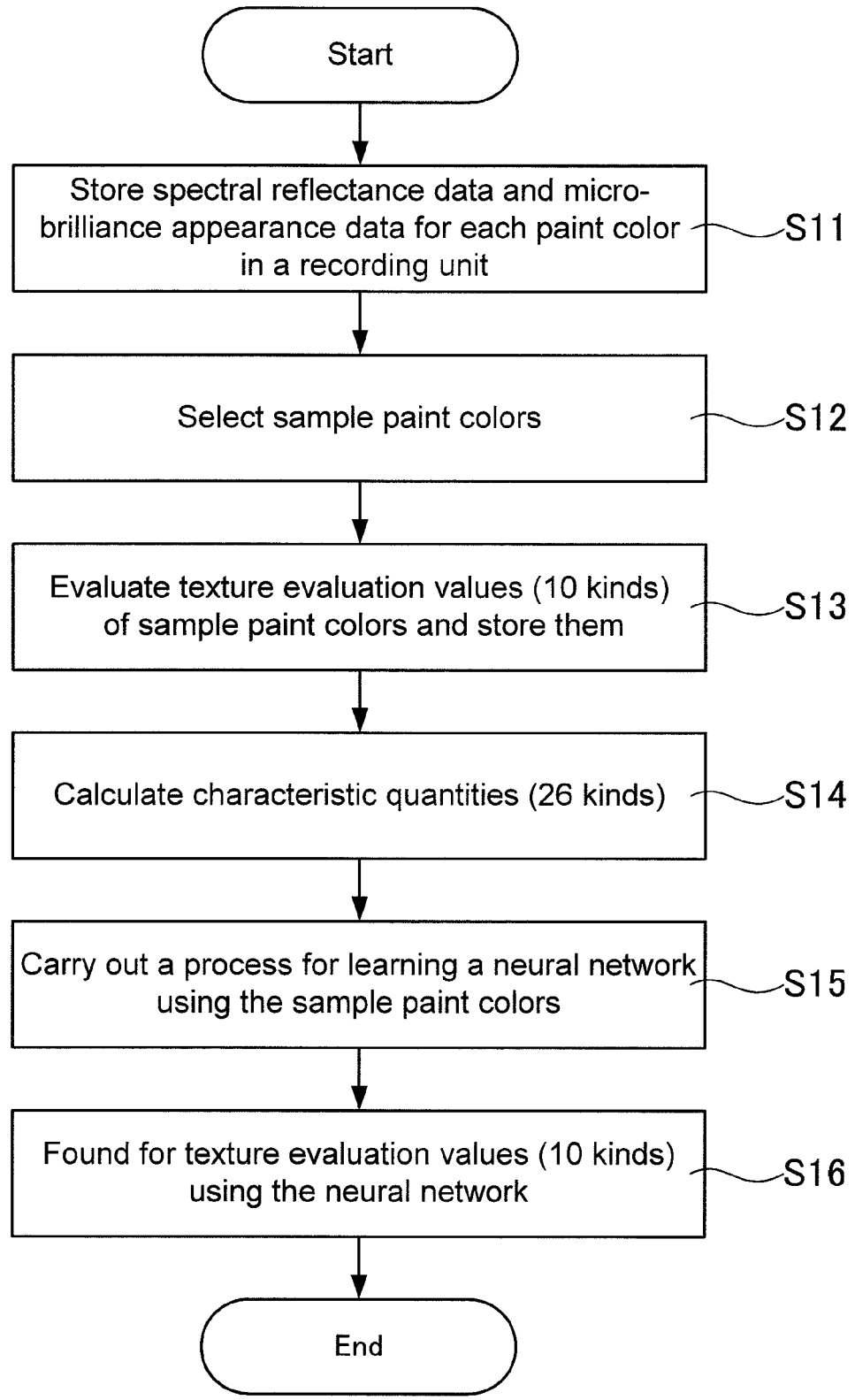
FIG. 2 A flow chart showing a method of creating the texture database according to the first embodiment of the present invention.

The following first explains a method of creating a texture database, and, secondly, a paint color search method using the created texture database. FIG. 2 is a flow chart showing a method of creating a texture database according to the first embodiment of the present invention.

The following steps are carried out by the arithmetic unit 1, unless otherwise specified. The process carried out by the arithmetic unit 1 is a process carried out by the CPU 11. The CPU 11 temporarily stores all of the necessary data items (setting values, data being processed etc.) in the memory 12, which serves as a working space. The CPU 11 also stores data items in the recording unit 13 in the following processing manner. The CPU 11 further displays the data stored in the memory 12 or the recording unit 13 as an image or text on the display apparatus 3. The paint color-related information for each stock color is associated with a corresponding paint color code and stored in the recording unit 13 in advance. Color sample cards of these stock colors are used as the coating films 5.

In step S11, the spectral reflectance data and the micro-brilliance appearance data for each stock color is associated with a corresponding paint color code, and is stored in the recording unit. First, the surface of the coating film 5 is irradiated with light at an irradiation angle of 45° (an angle within the plane vertical to the surface of the coating film). Then, spectral reflectances are measured using a spectrophotometer 2 at five observation angles (may also be referred to as light-receiving angles) 15°, 25°, 45°, 75°, and 110° as five angle variations (angles within the plane vertical to the surface of the coating film) of the specular reflection light direction. The spectrophotometer 2 is realized by, for example, a multi-angle spectrophotometer MA68II (X-Rite, Inc.). The measured spectral reflectance data is transmitted to the arithmetic unit 1 via the I/F unit 16, and is associated with information indicating the angle variation at the measurement and a corresponding paint color code. The associated data is stored in the recording unit 13.

Next, the image data of the coating film 5 is obtained using an imaging device 4. Based on the obtained image data, the micro-brilliance appearances expressed as HG, HB, HBL, and SB are calculated. The calculated micro-brilliance appearance data (HG, HB, HBL, and SB) are associated with the paint color code, and the associated data is stored in the recording unit 13. Since HG, HB, HBL, and SB are publicly known, and their definition, measurement method and calculation method are disclosed in Non-Patent Document 1, Non-Patent Document 2 etc., the following explains them only briefly, and detailed descriptions are omitted.

Among the data items indicating the micro-brilliance appearances, HG (High-light Graininess) expresses particle feeling, and HB (High-light Brilliance) expresses glittering appearance. HG and HB are found according to the following formulas.

In cases where IPSL≧0.32: HG=500·IPSL−142.5
In cases where 0.32>IPSL≧0.15: HG=102.9·IPSL−15.4
In cases where 0.15>IPSL: HG=0

$$HB=(BV-50)/2$$

Here, IPSL (Integration of Power Spectrum of Low Frequency) and BV (Brilliance Value) are found according to the following formulas.

$$IPSL = \int_0^N \int_0^{2\pi} P(v,\theta) dv d\theta / P(0,0)$$

$$BV = PHav + 350 PSav$$

In these formulas, $P(v,\theta)$ represents a power spectrum obtained by subjecting two-dimensional luminance distribution data generated by the obtained image data to a two-dimensional Fourier transform, $v$ represents a spatial frequency, and $\theta$ represents an angle. 0 to N are spatial frequency regions for the particle feeling. PHav and PSav respectively represent an average peak height and an average peak skirt of the luminance image, wherein PHav=3V/A and PSav=L/PHav. Here, V and A respectively represent the gross luminance volume and the gross luminance area greater than a threshold="an average gray level of image data (GL, hereinafter)+32" binarized by the threshold. L represents an average particle diameter binarized by a threshold="GL+24".

Among the data items indicating the micro-brilliance appearances, HBL (High-light Brilliance at Low-illuminance) is found from image data taken under low light exposure conditions, i.e., GL=14, using the above formula for finding HB. SB (Shade Brilliance) is an HG taken under a condition where GL=125.

In Step S12, sample paint colors are selected from the set of stocked paint colors to be used for the later-described neural network training. In the first embodiment of the present invention, the textures of the paint colors are expressed by, for example, the 10 kinds of impression terms shown in Table 1.

TABLE 1

| Impression Term | Definition |
| --- | --- |
| Deepness Appearance | Highly chromatic, but brightness is not high in the highlight side; not cloudy, and is a black texture in the shade side (lowered when contrast between the highlight side and the shade side is too strong). |
| Three-dimensional Appearance | Laminate-like particulate texture in the area from the highlight side to the shade side. |
| Chromaticness | Chromatic and vivid texture. |
| Translucent Appearance | Highly brightened texture, and shines white at the highlight side. |
| Nuance | Texture with different color phases between the highlight side and shade side (lowered when the color phases are clearly distinguishable). |
| Solid | Texture with little color change in the shade side (textures with no color change are excluded). |
| Color Band | Color recognition texture towards the direction of the shade side. |
| Smooth Appearance | Dense texture with a moderate change in brightness, and having a film coating-like appearance. |
| Metallic Appearance | Highly brightened, not particulate but dense texture in the highlight side. Difference in brightness between the highlight side and the shade side. |
| Clear Feeling | No metallic texture with low chromaticness. Difference in brightness between the highlight side and the shade side. |

It is preferable to select sample paint colors having textures expressed by the impression terms shown in Table 1, while avoiding bias toward a specific texture.

In Step S13, the textures of the selected sample paint colors are evaluated, the resulting evaluation values are associated with paint color codes, and the associated data are stored in the recording unit. First, the computer graphic image of each sample paint color stored in the recording unit 13 is displayed in the display apparatus 3, and a plurality of experienced designers evaluate the texture of the sample paint color for each of the textures expressed by the impression terms shown in Table 1. The evaluation results are thereafter inputted via the operating unit 15. By repeating this process, the texture evaluation sheet shown in Table 2 is created, which is in the form of electronic data or the like. The texture evaluation sheet shows a plurality of texture evaluation values expressed by the impression terms (10 kinds) for each sample paint color. As the texture evaluation value, "1" is set when the color has the texture, and "0" is set when the color does not have the texture. For example, for the sample paint color 01 in Table 2, the sample paint color was evaluated to have only solidity and color band; therefore the value "1" is set in the corresponding cell, while the value "0" is set in the remaining cells. The texture evaluation values recorded in the texture evaluation sheet are associated with the paint color codes, and are stored in the recording unit 13.

TABLE 2

| | Deepness Appearance | Three-dimensional Appearance | Chromaticness | Translucent Appearance | Nuance | Solid | Color Band | Smooth Appearance | Clear Feeling | Metallic Appearance |
|---|---|---|---|---|---|---|---|---|---|---|
| Sample 01 | 0 | 0 | 0 | 0 | 0 | 1 | 1 | 0 | 0 | 0 |
| Sample 02 | 0 | 0 | 1 | 0 | 1 | 0 | 0 | 0 | 1 | 1 |
| Sample 03 | 0 | 0 | 0 | 1 | 0 | 0 | 0 | 0 | 0 | 1 |
| Sample 04 | 0 | 0 | 0 | 0 | 0 | 0 | 0 | 0 | 0 | 1 |
| Sample 05 | 0 | 1 | 0 | 0 | 1 | 0 | 0 | 0 | 0 | 1 |
| Sample 06 | 0 | 1 | 0 | 0 | 0 | 0 | 0 | 0 | 0 | 1 |
| Sample 07 | 0 | 0 | 0 | 1 | 0 | 0 | 0 | 0 | 0 | 1 |
| Sample 08 | 0 | 0 | 0 | 0 | 0 | 0 | 0 | 0 | 1 | 1 |
| Sample 09 | 1 | 1 | 0 | 0 | 1 | 0 | 0 | 0 | 0 | 0 |
| Sample 10 | 0 | 1 | 0 | 0 | 0 | 0 | 0 | 0 | 1 | 1 |
| Sample 11 | 0 | 1 | 0 | 0 | 1 | 0 | 0 | 1 | 0 | 0 |
| Sample 12 | 0 | 1 | 0 | 0 | 1 | 0 | 0 | 0 | 0 | 1 |
| Sample 13 | 0 | 0 | 0 | 0 | 0 | 0 | 1 | 0 | 0 | 0 |
| — | — | — | — | — | — | — | — | — | — | — |
| Sample 200 | 0 | 0 | 0 | 0 | 1 | 1 | 0 | 0 | 0 | 0 |

In Step S14, using the spectral reflectance data, characteristic quantities (26 kinds) expressing the following textures are calculated for each stock color. The calculation results are associated with the paint color codes and stored in the recording unit 13.

First, based on the spectral reflectance at 15°, a characteristic quantity $L^*_{15}$, a characteristic quantity $a^*_{15}$, and a characteristic quantity $b^*_{15}$, which are L* value (brightness), a* value, and b* value (respectively $L^*_{15}$, $a^*_{15}$, and $b^*_{15}$, hereinafter) at the observation angle of 15° in the L*a*b* color space, are calculated. Similarly, based on the spectral reflectance at 45°, a characteristic quantity $L^*_{45}$, a characteristic quantity $a^*_{45}$, and a characteristic quantity $b^*_{45}$ are calculated. Further, based on the spectral reflectance at 75°, a characteristic quantity $L^*_{75}$, a characteristic quantity $a^*_{75}$, and a characteristic quantity $b^*_{75}$ are calculated.

Next, based on the spectral reflectance at 15°, a Y value (brightness) ($Y_{15}$, hereinafter) in the XYZ color space is calculated. Similarly, $Y_{25}$, $Y_{45}$, $Y_{75}$ and $Y_{110}$ are calculated based on the spectral reflectances at 25°, 45°, 75° and 110°, respectively. Next, a characteristic quantity FF(15,25) is calculated according to $2\times(Y_{15}-Y_{25})/(Y_{15}+Y_{25})$. Similarly, a characteristic quantity FF(25,45), a characteristic quantity FF(45,75), a characteristic quantity FF(75,110) and a characteristic quantity FF(15,45) are calculated according to $2\times(Y_{25}-Y_{45})/(Y_{25}+Y_{45})$, $2\times(Y_{45}-Y_{75})/(Y_{45}+Y_{75})$, $2\times(Y_{75}-Y_{110})/(Y_{75}+Y_{110})$, and $2\times(Y_{15}-Y_{45})/(Y_{15}+Y_{45})$, respectively.

Next, based on the spectral reflectance at 15°, a characteristic quantity $c^*_{15}$, which is a c* value (chromaticness) ($c^*_{15}$, hereinafter) in the L*C*h* color space, is calculated. Similarly, a characteristic quantity $c^*_{45}$ and a characteristic quantity $c^*_{75}$ are calculated based on the spectral reflectances at 45° and at 75°, respectively. Similarly, a characteristic quantity $c^*_{25}$ and a characteristic quantity $c^*_{110}$ are calculated based on the spectral reflectances at 25° and at 110°, respectively. Next, a characteristic quantity cFF(15,25) is calculated according to $2\times(c^*_{15}-c^*_{25})/(c^*_{15}+c^*_{25})$. Similarly, a characteristic quantity cFF(25,45), a characteristic quantity cFF(45,75), a characteristic quantity cFF(75,110) and a characteristic quantity cFF(15,45) are calculated according to $2\times(c^*_{25}-c^*_{45})/(c^*_{25}+c^*_{45})$, $2\times(c^*_{45}-c^*_{75})/(c^*_{45}+c^*_{75})$, $2\times(c^*_{75}-c^*_{110})/(c^*_{75}+c^*_{110})$ and $2\times(c^*_{15}-c^*_{45})/(c^*_{15}+c^*_{45})$, respectively.

Further, the values of HG, HB, HBL and SB associated with the paint color codes in the recording unit 13 are also used as characteristic quantities. These 26 kinds of characteristic quantities thus obtained are associated with the paint color code, and are stored in the recording unit 13.

Figure 3:
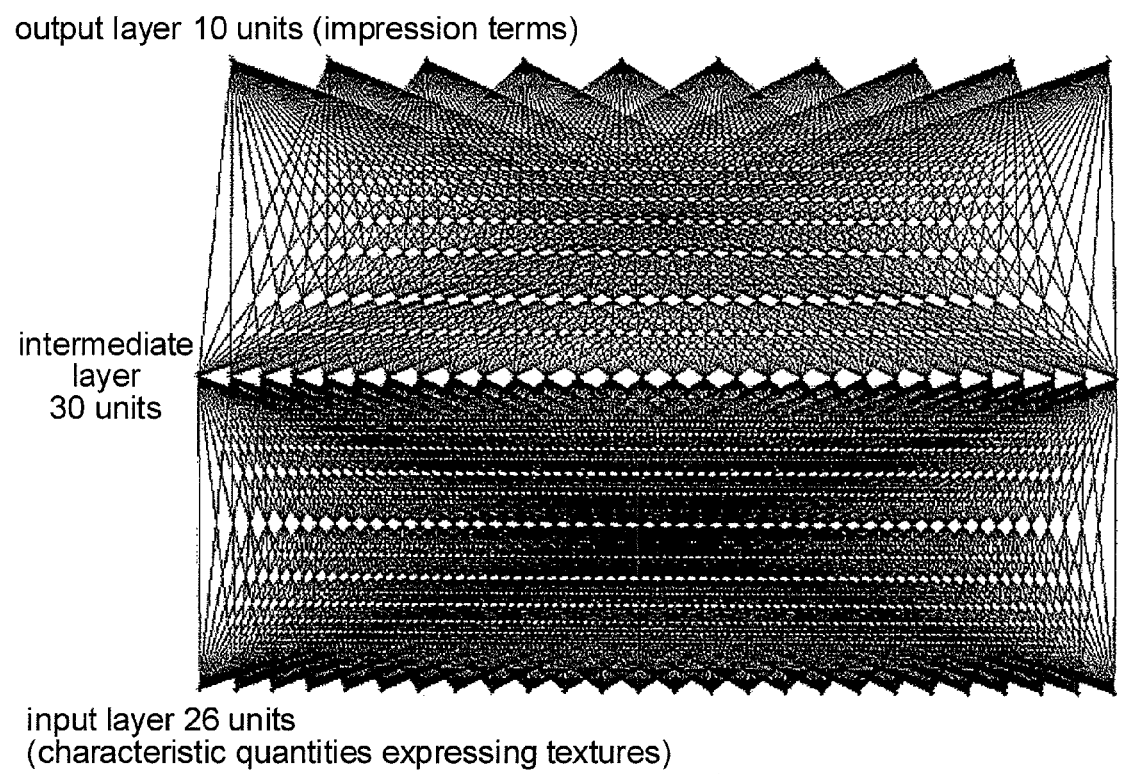
FIG. 3 A drawing showing an example of a structure of a neural network used for creating the texture database according to the first embodiment of the present invention.

In Step S15, a neural network is constructed, and a process for training the neural network is carried out using the characteristic quantities of the sample paint colors as training data. FIG. 3 is a drawing illustrating a structure example of a neural network. The first embodiment uses, as the algorithm of the neural network, an error back propagation algorithm, which is one of the supervised training methods. Since error back propagation algorithms are publicly known, the explanation thereof is omitted. As shown in FIG. 3, a neural network having one intermediate layer consisting of 30 units is constructed. In the neural network, each unit of the input layer corresponds to one of the characteristic quantities (26 kinds) expressing the textures, which are defined in Step S14, while each unit of the output layer corresponds to one of the impression terms (10 kinds). Then, after setting a training rate (a real value ranging from 0 to 1), which is a parameter showing the training speed, and a permissible error (a real value ranging from 0 to 1), which is a permissive error of the output value in the training, the process for training the neural network is carried out. As a result, the characteristic quantities (26 kinds) expressing the textures, found from the spectral reflectance measurement values, are associated with the texture evaluation values determined by the experienced designers. The information for reconstructing the determined neural network, i.e., information regarding the characteristic quantities and impression terms corresponding to the units of the input layer and the output layer, and the construction information of the neural network, such as synaptic weight data and the like of the neural network determined through the training, are stored in the recording unit 13.

In Step S16, using the neural network after the training process, the texture evaluation value is found for each stock color, and the obtained texture evaluation values are associated with each paint color code and stored in the recording unit 13, thereby completing a texture database. More specifically, a neural network is constructed using information for constructing the neural network determined in Step S15, the characteristic quantities (26 kinds) for each stock color found in Step S14 are inputted to each unit of the input layer, and the values obtained from the units of the output layers (a real value ranging from 0 to 1) are associated with the paint color code as corresponding texture evaluation values and stored in the recording unit 13, thereby completing a texture database.

Figure 4:
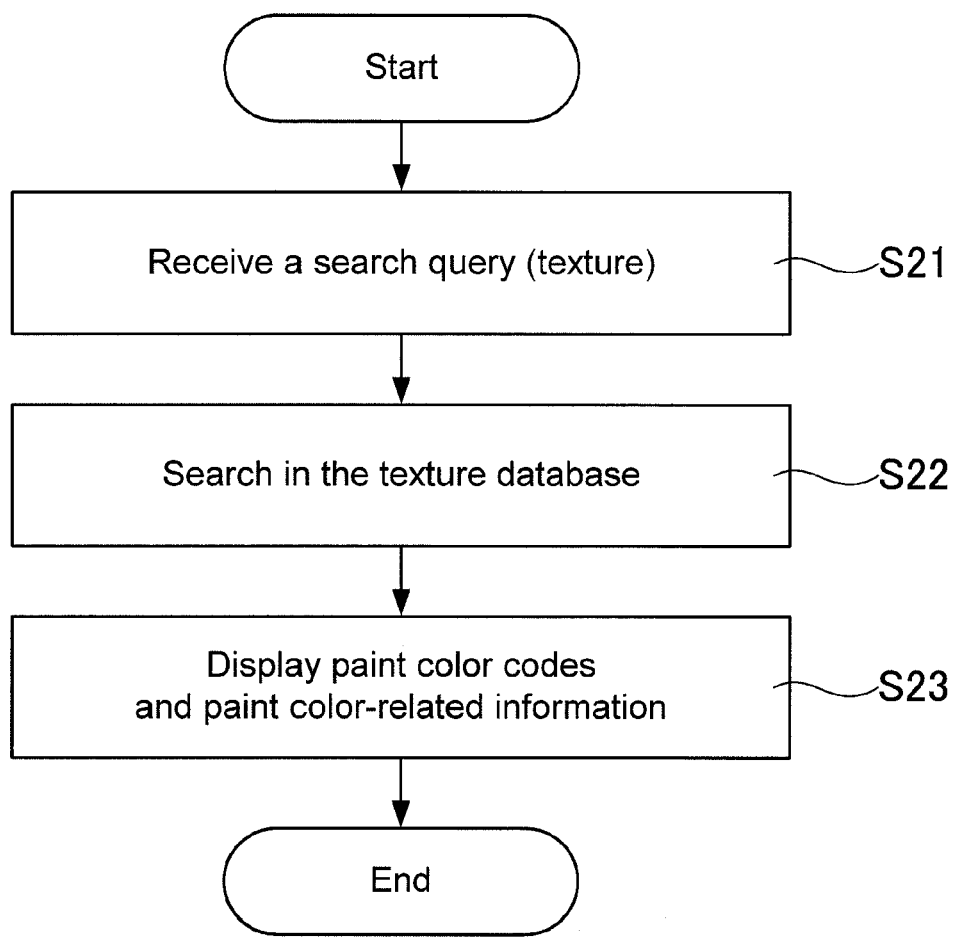
FIG. 4 A flow chart showing a method of searching the texture database which the system shown in FIG. 1 performs.
Figures 5, 6:
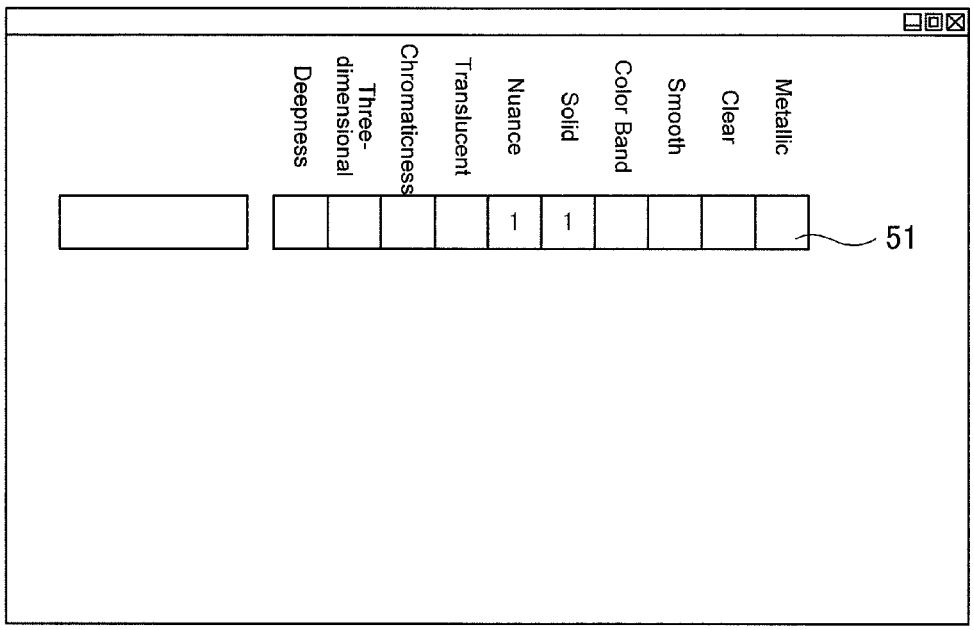
FIG. 5 A drawing showing an example of an input screen of the system.
FIG. 6 A drawing showing an example of an output screen of the system.

The following describes a method of searching for a paint color having a desired texture from the created texture database. FIG. 4 is a flow chart showing a texture database search method performed by the system shown in FIG. 1. FIG. 5 is a drawing illustrating one example of the input screen of the system. FIG. 6 is a drawing illustrating one example of the output screen of the system.

In Step S21, a request for a desired texture is received as a search query. As shown in FIG. 5, when a value "1" (i.e., the color has the texture) is set in the entry field 51 corresponding to the texture via the operating unit 15, the texture is set as the search query. To set the absence of the texture as the search query, the user who carries out the search sets a value "0" (i.e., the color does not have the texture) in the entry field 51 corresponding to the texture. The texture with a blank entry field 51 is not used as the search query. For example, as shown in the input example of FIG. 5, when searching for a paint color having a nuanced appearance and solidity, assuming that the parameter corresponding to the texture "nuanced appearance" is "nuance", and the parameter corresponding to the texture "solidity" is "solid", the search query is "nuance=1 and solid=1".

In Step S22, a search is carried out in the texture database to find a paint color that matches the search query. The texture evaluation values found by the neural network in Step S16, which is stored in the recording unit 13 as a database, are real values ranging from 0 to 1. When the texture evaluation value is a number other than 0 or 1, the determination as to whether the corresponding paint color has the desired texture is carried out as follows. For example, a predetermined threshold (a real value ranging from 0 to 1) is set, and the paint color is determined "to have the texture (corresponding parameter=1)" when the texture evaluation value stored in the texture database is equal to or greater than the threshold value, and the paint color is determined "not to have the texture (corresponding parameter=0)" when the texture evaluation value stored in the texture database is less than the threshold value. For example, the threshold can be set to 0.5.

More specifically, in Step S22, among the evaluation values of the textures (10 kinds) stored in the texture database, the relative magnitude between the texture evaluation value (real value) specified by a search query "having the texture (corresponding parameter=1)" and the predetermined threshold value is compared, thereby determining that the said paint color matches the search query or not. Among plural paint color codes of stock colors, the paint color code of the paint color that matches the query is given as a search result. For example, as shown in the input example of FIG. 5, when searching for a paint color having a nuanced appearance and solidity, because the search query is "nuance=1 and solid=1", a paint color code of a paint color having a texture evaluation value equal to or greater than the threshold 0.5 for "nuanced appearance" and having a texture evaluation value equal to or greater than the threshold 0.5 for "solidity" is found among the texture evaluation values stored in the texture database, and the paint color code is given as a search result.

The following describes a method of searching for a paint color by specifying the absence of a certain texture.

For example, when searching for a paint color having solidity but not having a chromaticness appearance, the user may input "1" in the "solid" column and "0" in the "chromaticness" column. As a result, assuming that the parameter corresponding to the texture "chromaticness" is "chroma", the search query is "solid=1 and chroma=0". When the threshold is 0.5, a paint color code of a paint color having a texture evaluation value equal to or greater than the threshold 0.5 for "solid" and having a texture evaluation value less than the threshold 0.5 for "chromaticness" is found among the texture evaluation values stored in the texture database, and the paint color code is given as a search result.

In Step S23, the paint color code and paint color-related information as the search result are displayed in the display apparatus. As shown in FIG. 6, display apparatus 3 displays information items of the paint color that matches the search query i.e., the paint color-related information stored in the texture database, such as a paint color code 52, a computer graphic image 53 of the paint color, and the like. The paint color as the search result can be displayed in the sorted form in order of the evaluation values stored in the texture database, with respect to the texture specified by the search query.

Next, the second embodiment of the present invention is described below. The second embodiment of the present invention creates a database regarding a color category of the paint colors (color category database, hereinafter), and carries out a search for a paint color that matches a desired color category from the created color category database. The color category database according to the second embodiment of the present invention is created in a system having the same structure as in the first embodiment shown in FIG. 1; therefore, the explanation of the system is omitted.

Figure 7:
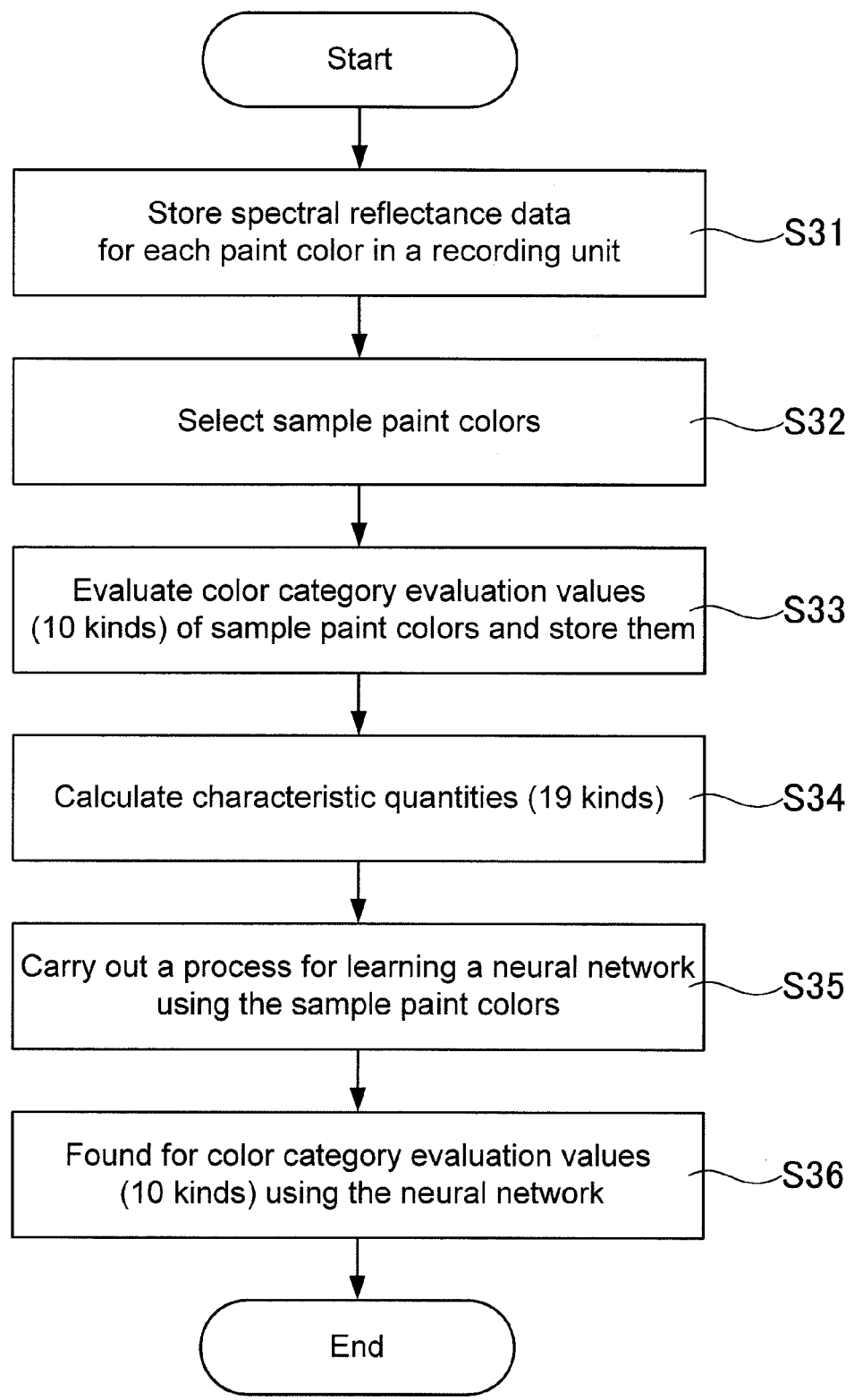
FIG. 7 A flow chart showing a method of creating a color category database according to a second embodiment of the present invention.

FIG. 7 is a flow chart showing a method of creating a color category database according to the second embodiment of the present invention.

In Step S31, the spectral reflectance data for each stock color is associated with a corresponding paint color code, and is stored in the recording unit. As in Step S11, spectral reflectances are measured using the spectrophotometer 2 at three observation angles, 15°, 45°, and 110°. The measured spectral reflectance data are associated with a corresponding paint color code. The associated data is stored in the recording unit 13.

In Step S32, sample paint colors are selected from the set of stock colors to be used for the later-described neural network training. In the second embodiment of the present invention, the paint colors are classified into a plurality of categories. For example, each paint color is given an attribute expressed by 10 kinds of terms (color category terms, hereinafter), i.e., white, silver, black, red, beige, yellow, green, turquoise, blue and purple. These color category terms correspond to the impression terms in the first embodiment. It is preferable to select sample paint colors that appear to belong to the color categories expressed by the color category terms, while avoiding bias toward a specific color category.

In Step S33, the color categories of the selected sample paint colors are evaluated, the resulting evaluation values are associated with paint color codes, and the associated data are stored in the recording unit. As in Step S13, a plurality of experienced designers evaluate the color category of the sample paint color for each of the color categories expressed by the color category terms. The evaluation results are thereafter inputted via the operating unit 15. By repeating this process, a color category evaluation sheet shown in Table 3, which is in the form of electronic data or the like, is created. The color category evaluation sheet shows a plurality of evaluation values of the color categories expressed by the color category terms (10 kinds) for each sample paint color. As the evaluation value of the color category, "1" is set when the color appears to belong to the color category, and "0" is set when the color does not appear to belong to the color category. The color category evaluation values recorded in the color category evaluation sheet are associated with the paint color codes, and are stored in the recording unit 13. In the second embodiment, only one color category is determined for each sample paint color.

TABLE 3

|  | White | Silver | Black | Red | Beige | Yellow | Green | Turquoise | Blue | Purple |
|---|---|---|---|---|---|---|---|---|---|---|
| Sample 01 | 0 | 0 | 0 | 0 | 0 | 1 | 0 | 0 | 0 | 0 |
| Sample 02 | 0 | 0 | 1 | 0 | 0 | 0 | 0 | 0 | 0 | 0 |
| Sample 03 | 1 | 0 | 0 | 0 | 0 | 0 | 0 | 0 | 0 | 0 |
| Sample 04 | 0 | 0 | 0 | 0 | 0 | 0 | 0 | 0 | 0 | 1 |
| Sample 05 | 0 | 1 | 0 | 0 | 0 | 0 | 0 | 0 | 0 | 0 |
| Sample 06 | 0 | 1 | 0 | 0 | 0 | 0 | 0 | 0 | 0 | 0 |
| Sample 07 | 0 | 0 | 0 | 1 | 0 | 0 | 0 | 0 | 0 | 0 |
| Sample 08 | 0 | 0 | 0 | 0 | 0 | 0 | 0 | 0 | 1 | 0 |
| Sample 09 | 1 | 0 | 0 | 0 | 0 | 0 | 0 | 0 | 0 | 0 |
| Sample 10 | 0 | 0 | 0 | 0 | 0 | 0 | 0 | 0 | 1 | 0 |
| Sample 11 | 0 | 0 | 0 | 0 | 0 | 0 | 0 | 1 | 0 | 0 |
| Sample 12 | 0 | 1 | 0 | 0 | 0 | 0 | 0 | 0 | 0 | 0 |
| Sample 13 | 0 | 0 | 0 | 0 | 0 | 0 | 1 | 0 | 0 | 0 |
| — | — | — | — | — | — | — | — | — | — | — |
| Sample 756 | 0 | 0 | 0 | 0 | 1 | 0 | 0 | 0 | 0 | 0 |

In Step S34, using the spectral reflectance data, characteristic quantities (19 kinds) expressing the following color categories are calculated for each stock color. The calculation results are associated with the paint color codes and stored in the recording unit 13.

As in Step S14, first, based on the spectral reflectance at 15°, a characteristic quantity $L^*_{15}$, a characteristic quantity $a^*_{15}$, and a characteristic quantity $b^*_{15}$, which are $L^*$ value, $a^*$ value, and $b^*$ value at the observation angle of 15° in the $L^*a^*b^*$ color space, are calculated. Similarly, based on the spectral reflectance at 45°, a characteristic quantity $L^*_{45}$, a characteristic quantity $a^*_{45}$, and a characteristic quantity $b^*_{45}$ are calculated. Further, based on the spectral reflectance at 110°, a characteristic quantity $L^*_{110}$, a characteristic quantity $a^*_{110}$, and a characteristic quantity $L^*_{110}$ are calculated.

Next, based on the spectral reflectance at 15°, a characteristic quantity $c^*_{15}$, which is a $c^*$ value in the $L^*C^*H^*$ color space, is calculated, and a hue angle h ($h_{15}$, hereinafter) at 15° is calculated according to $h=\tan^{-1}(b^*/a^*)$, thereby finding a characteristic quantity $\sin(h_{15})$ and a characteristic quantity $\cos(h_{15})$. Similarly, based on the spectral reflectance at 45°, a characteristic quantity $c^*_{45}$ is calculated, and a hue angle $h_{45}$ is calculated, thereby finding a characteristic quantity $\sin(h_{45})$ and a characteristic quantity $\cos(h_{45})$. Further, based on the spectral reflectance at 110°, a characteristic quantity $c^*_{110}$ is calculated, and a hue angle $h_{110}$ is calculated, thereby finding a characteristic quantity $\sin(h_{110})$ and a characteristic quantity $\cos(h_{110})$.

Next, based on the spectral reflectance at 15°, $Y_{15}$, which is a Y value in the XYZ color space, is calculated. Similarly, $Y_{45}$ is calculated based on the spectral reflectance at 45°, and a characteristic quantity FF (15,45) is calculated according to $2\times(Y_{15}-Y_{45})/(Y_{15}+Y_{45})$. These 19 kinds of characteristic quantities thus obtained are associated with the paint color codes, and are stored in the recording unit 13.

In Step S35, a neural network is constructed, and a process for training the neural network is carried out using the characteristic quantities of the sample paint colors as training data. As in Step S15, a neural network having one intermediate layer consisting of 30 units is constructed. In the neural network, each unit of the input layer corresponds to one of the characteristic quantities (19 kinds) expressing the color categories, which are defined in Step S34, while each unit of the output layer corresponds to one of the color category terms (10 kinds). Then, after setting a training rate to 0.5 and a permissible error to 0.2, the process for training the neural network is carried out. The information for reconstructing the determined neural network, i.e., information regarding the characteristic quantities and color category terms corresponding to the units of the input layer and the output layer, and the construction information of the neural network, such as synaptic weight data and the like of the neural network determined through the training, are stored in the recording unit 13.

In Step S36, using the neural network after the training process, the color category evaluation value is found for each stock color, and the obtained color category evaluation values are associated with the paint color codes and stored in the recording unit 13, thereby completing a color category database. More specifically, as in Step S16, a neural network is constructed using information for constructing the neural network determined in Step S35, the characteristic quantities (19 kinds) for each stock color found in Step S34 are inputted to each unit of the input layer, and the values obtained from the units of the output layers (a real value ranging from 0 to 1) are associated with the paint color codes as corresponding color category evaluation values and stored in the recording unit 13, thereby completing a color category database.

The following describes a method of searching for a paint color that belongs to the desired color category from the created color category database.

In Step S41, as in Step S21, a request for a desired color category is received as a search query. For example, when searching for a paint color belonging to a green-based color category, assuming that the parameter corresponding to the color category "Green" is "green", the search query is "green=1".

In Step S42, a search is carried out in the color category database to find a paint color that matches the search query. As in Step S22, when the evaluation value of the color category is a number other than 0 or 1, the determination as to whether the corresponding paint color belongs to the desired category is carried out as follows. For example, it is determined that the paint color expressed by the paint color code "belongs (1)" to the color category of the largest color category evaluation value among the plural color categories of the paint color code, and "does not belong (0)" to the remaining color categories.

More specifically, in Step S42, among the color category evaluation values (10 kinds) stored in the color category database, determination is carried out as to whether the particular color category evaluation value (real value) specified by a search query that "belonging to a color category (parameter=1)" is the maximum value among all of the color category evaluation values of the same paint color code, thereby determining that the said paint color matches the search query or not. Among plural paint color codes of stock colors, the paint color code of the paint color that matches the search query is given as a search result. For example, when searching for a paint color belonging to a green-based color category, because a search query "green=1", a search is carried out among the color category evaluation values stored in the color category database, so as to find a paint color code in which the evaluation value of the color category "Green" that corresponds to a parameter "green" is the maximum value among all of the color category evaluation values of the same paint color code. This paint color code of the paint color that matches the search query is given as a search result.

In Step S43, as in Step S23, the paint color code and paint color-related information as the search result are displayed in the display apparatus.

Although the present invention is explained with a specific embodiment, the present invention is not limited to the specific embodiments described above.

Although the texture database and the color category database are separately created in the above embodiment, it is possible to create a unified database consisting of the texture database and the color category database, and carry out a search for a paint color that matches the desired texture and/or the color category with the unified database. More specifically, in accordance with the processes of Step S11 to Step S16 and Step S31 to Step S36 described in the first and second embodiments, the search may be carried out such that a database is created by associating texture evaluation values and color category evaluation values with the paint color codes for each of the stock colors, and in accordance with the processes of Step S21 to Step S23 and Step S41 to Step S43 described in the first and second embodiments, a paint color that matches the search query is found from the created database according to a search query that specifies the desired texture and/or the color category. This method enables an easy search for a paint color, for example, "a green-based paint color having solidity but not having a chromaticness appearance", by using a search query that specifies both the desired texture and the color category requested by the user at the time of paint color design. Alternatively, instead of separately creating one neural network for creating a texture database and the other neural network for creating a color category database, and carrying out separate training processes for those neural networks, it is possible to carryout the training process for a single neural network instead of those networks.

Eliminating bias toward a specific texture is not always required to be taken into account in the selection of a sample paint color. Insofar as the process selects at least one sample paint color having a texture of one of the impression terms shown in Table 1, the rest of the sample paint colors may be selected at random from the stock colors. Similarly, when creating the color category database, insofar as at least one sample paint color that appears to belong to a color category expressed by the color category term is selected, the rest of the sample paint colors may be selected at random from the stock colors.

Although the evaluation of the textures and the color categories of the sample paint colors are carried out by experienced designers in the above embodiment, the evaluation may be carried out by other evaluators who have a steady evaluation standard and are capable of evaluating the textures and color categories of paint colors based on the specific evaluation standard. For example, the evaluation may be carried out by color designers of the industrial products, or engineers of the paint company.

Although the evaluation of the textures and the color categories are carried out by a plurality of experienced designers in the above embodiment, the evaluation may be carried out by a single evaluator. In this case, it is preferable to eliminate the influence of the learning effect by, for example, carrying out the evaluation of the textures and the color categories a plurality of times.

Although, in the above embodiment, a texture evaluation value is set to "1" when the paint color appears to have the texture and to "0" when the paint color does not appear to have the texture, i.e., the texture evaluation value is expressed as the presence/absence (two scales) of the texture, the texture evaluation value may be expressed by three or five scales. Also in this case, the texture evaluation value for specifying the presence/absence of the texture is set in the entry field 51 as a search query, the relative magnitude between the texture evaluation value expressed by a plurality of scales set as the search query and the texture evaluation value stored in the texture database is compared, thereby determining that the paint color matches the search query or not.

Although, in the above embodiment, characteristic quantities (the above 26 kinds of characteristic quantities for the textures, and the above 19 kinds of characteristic quantities for the color categories) found from the spectral reflectances are used as the characteristic quantities for expressing the textures or the color categories of the paint colors, it is also possible to use the tristimulus values XYZ (CIE1964 color space) or the spectral reflectances in the visible light region as the characteristic quantities.

Although, in the above embodiment, the presence/absence of the textures are determined by setting the threshold to a predetermined fixed value (0.5) and comparing the relative magnitude between the texture evaluation values stored in the database and the threshold value, it is also possible to use the permissible error as the threshold, and determine that the paint color "has the texture (1)" when the texture evaluation value stored in the database is greater than the threshold. For example, if the evaluation value of the "deepness appearance" is 0.5 and the permissible error (i.e., threshold) is 0.1, it is determined that the paint color has the texture "deepness appearance". This enables the system to accurately find all of the paint colors having the target texture.

Further, it is also possible to use (1.0-permissible error) as the threshold, and determine that the paint color "has the texture (1)" when the texture evaluation value stored in the database is greater than the threshold. For example, if the evaluation value of the "deepness appearance" is 0.5 and the permissible error is 0.1, it is determined that the paint color does not have the texture "deepness appearance". This enables the system to eliminate a noise (wrong search results) during the search for paint colors having the target texture.

Further, as shown in the following formula, it is possible to calculate the difference (matching degree) between the evaluation value stored in the database and the value included in the search query, and display the calculated results in the sorted form in order of the size of matching degree.

$$\text{matching degree of textures} = \Sigma_i(1.0-y_1(i))+\Sigma_j(y_2(j))$$

In the formula, i and j are numbers given to the individual textures with no overlaps. More specifically, $y_1(i)$ is an evaluation value of the texture (i) stored in the database and specified by the search query "the color has the texture", and $y_2(j)$ is an evaluation value of the texture (j) stored in the database and specified by the search query "the color does not have the texture". $\Sigma_i$ and $\Sigma_j$ are operators to find the sums of i and j, respectively.

Although, in the above second embodiment, only one color category is determined for each sample paint color, the system can allot a plurality of categories for one paint color. For example, a paint color has multicolor effect that varies in hue from, e.g., blue to green, depending on the observation angle, the paint color may be determined to belong to both blue and green color categories. Similarly, a given paint color may be determined to belong to both beige and yellow color categories.

Although, in the above embodiment, the presence of the texture of the paint color or the color category to which the paint color belongs is determined by storing the output value (a real value ranging from 0 to 1) of the neural network in the database as it is, and by carrying out a search for the texture through comparing the relative magnitude between the texture evaluation values and the predetermined threshold, or by carrying out a search for the color category through determining whether the particular evaluation value is the maximum value among all of the evaluation values of the color categories of the same paint color code, the present invention is not limited to this method. For example, when storing the predicted evaluation value of the texture or the predicted evaluation value of the color category, the presence of the texture of the target color or the color category to which the target color belongs may be determined and the determined results are stored in the database as a value of 1 or 0. In this case, the step of determining the presence of the texture of the target color or the color category to which the target color belongs during the search is not necessary. This increases the search speed.

If the texture or the color category specified as a search query by the user greatly differ from the texture or the color category of the computer graphic image displayed as the search result, the user may determine the evaluation value of the texture or the evaluation value of the color category of the displayed image, and, in a similar manner as the above described process, a process of retraining the neural network may be carried out. This retraining provides more appropriate synaptic weight data, thereby increasing the search accuracy.

Example 1

Hereunder, the present invention is described in further detail with reference to Examples. In Examples 1 and 2, two procedures were conducted in advance as described below. First, spectral reflectances (light-receiving angles: 15, 25, 45, 75 and 110 degrees) and micro-brilliance appearance data (HG, HB, HBL and SB) for all of the stock colors were associated with paint color codes, and were stored in a recording unit in advance. Secondly, a characteristic quantity calculator program, which calculates 26 kinds of characteristic quantities to be used for creating a texture database and 19 kinds of characteristic quantities to be used for creating a color category database; and a training program for a neural network were stored in the recording unit in advance. In Example 1, terms as shown in Table 1 were used as impression terms.

(1-1) Selection of Paint Color Samples

First, according to a method taught in Patent Document 2 (Japanese Unexamined Patent Publication No. H11-211569), representative angles D were determined for each of the stock colors based on the data of spectral reflectances measured in the highlight side and in the shade side. Next, a multi-angle Spectrophotometer MA68II, product of X-Rite, Inc., was used to measure, at the representative angles D, the spectral reflectances of coating films produced by applying each of the stock colors. Then, based on the measured spectral reflectances, values of $a^*$ and $b^*$ in the $L^*a^*b^*$ color space were calculated, and the hue angle h was thereby calculated according to $h=\tan^{-1}(b^*/a^*)$.

Next, based on the calculated hue angles h (degree), all of the stock colors were classified into 4 groups; i.e., red group ($0 \leq h<45$, $315 \leq h<360$), yellow group ($45 \leq h<135$), green group ($135 \leq h<225$) and blue group ($225 \leq h<315$).

Thereafter, for the stock colors classified into 4 groups, a total of 4 kinds of texture maps of the red, yellow, green and blue groups were produced. A texture map is a map which is produced by arranging a plurality of paint colors on a two-dimensional plane using coordinate axes of two parameters that represent color and texture of the paint colors so that textures of paint colors are easily classified. The two parameters are a first principal component and a second principal component, which are determined by: determining at least three characteristic quantities based on a plurality of spectral reflectances that are measured at a plurality of light-receiving angles for each of the paint colors; and subjecting a data group including the at least three characteristic quantities to principal component analysis. The two parameters, the first principal component and the second principal component, are specifically a parameter representing the shading appearance of each paint color and a parameter representing the appearance heaviness of each paint color.

Next, each of the produced texture maps was partitioned at equal intervals along each direction of the vertical axis and horizontal axis. From each of the regions obtained as a result of the partition, one paint color was selected as a paint color sample. For example, paint color samples may be selected by: displaying a texture map on a display apparatus; and selecting, via an operating unit, a paint color shown in each of the partitioned regions in the texture map. 200 paint color samples were selected in the manner described above.

(1-2) Texture Evaluation of Paint Color Samples

For all 200 paint colors selected as paint color samples, computer graphic images of the paint color samples were displayed on a display apparatus, with which experienced designers with 10 or more years of experience designing paint colors evaluated the 10 kinds of textures expressed with the impression terms shown in Table 1, to thereby create the texture evaluation sheet shown in Table 2. The thus-obtained texture evaluation values were inputted via an operating unit so as to be stored in a recording unit 13.

(1-3) Constructing and Retraining of Neural Network

As training data, characteristic quantities and texture evaluation values of 135 paint colors which were arbitrarily selected from the selected 200 paint color samples were utilized. First, based on the spectral reflectance data and micro-brilliance appearance data stored in the recording unit in advance, an arithmetic unit calculated 26 kinds of characteristic quantities, which represent textures, using the characteristic quantity calculation program stored in the recording unit in advance. Subsequently, a neural network was constructed; and the calculated 26 kinds of characteristic quantities were associated with each unit of an input layer, and the obtained 10 kinds of texture evaluation values were associated with each unit of an output layer. The training rate was then set to 0.5 with a tolerance of 0.1, and the retraining of the neural network was carried out.

In order to verify the accuracy of the neural network after training, using this neural network after training, texture evaluation values for 65 paint colors that had not been utilized for the training among the selected 200 paint color samples were evaluated. With respect thereto, the threshold was set to 0.5, and the output data in the neural network were binarized and then compared with the texture evaluation values of the corresponding paint colors stated in the evaluation sheet; thereby, verification was carried out to determine whether the textures of the 65 paint colors that had not been utilized for the training were accurately predicted. Table 4 shows the results.

TABLE 4

| | Deepness Appearance | Three-dimensional Appearance | Chromaticness | Translucent Appearance | Nuance | Solid | Color Band | Smooth Appearance | Clear Feeling | Metallic Appearance |
|---|---|---|---|---|---|---|---|---|---|---|
| FAR (%) | 0 | 27 | 20 | 0 | 16 | 18 | 10 | 30 | 0 | 0 |
| FRR (%) | 0 | 3 | 9 | 5 | 17 | 2 | 20 | 9 | 2 | 20 |
| Accuracy Rate (%) | 100 | 86 | 89 | 95 | 83 | 95 | 82 | 88 | 98 | 83 |

The term "FAR" (False Acceptance Rate) used herein represents the percentage of the paint colors that were incorrectly predicted as not having a texture regardless of them having the texture (a leak rate); the term "FRR" (False Rejection Rate) represents the percentage of the paint colors that were incorrectly predicted as having a texture regardless of them not having the texture (a noise rate); and the term "Accuracy Rate" represents the percentage of the paint colors whose textures were correctly predicted. As shown in Table 4, the neural network after training precisely predicted the textures of the paint colors at a high accuracy of about 80% or more. Accordingly, the neural network was appropriately determined.

(1-4) Creation of Texture Database

Using the determined neural network, the texture evaluation values for about 20,000 stock colors were determined. The determined values were associated with the paint color codes of each paint color so as to be stored; thereby, a texture database was created.

(1-5) Search for a Paint Color with Texture

The requests of a desired texture expressed with an impression term were entered, and paint colors having the corresponding texture were searched in the database. Specifically, paint colors "with deepness appearance" were searched, and computer graphic images of the 2,456 paint colors retrieved were displayed on a display apparatus. Then, the experienced designer, who also evaluated the textures of the paint color samples, evaluated the textures of the displayed paint colors, and confirmed that paint colors "with deepness appearance" had been retrieved.

Additionally, two or more textures were combined to carry out a search for the corresponding paint colors. Specifically, paint colors that were "solid, not chromatic and not brightened" were searched, and computer graphic images of the 1,240 paint colors retrieved were displayed on the display apparatus. Then, the experienced designer, who also evaluated the textures of the paint color samples, evaluated the textures of the displayed paint colors, and confirmed that paint colors that were "solid, not chromatic and not brightened" had been retrieved.

Example 2

In Example 2, terms that make a paint color easily imaged were used as impression terms.

(2-1) Selection of Paint Color Samples

As paint color samples, 100 paint colors were arbitrarily selected from the 12,000 stock colors.

(2-2) Texture Evaluation of Paint Color Samples

For all 100 paint colors selected as paint color samples, computer graphic images of the paint color samples were displayed on a display apparatus, with which experienced designers evaluated the 2 kinds of textures expressed with the two impression terms "red as wine" and "blue as ice", to thereby create the texture evaluation sheet. Among the 100 paint color samples, 6 colors were evaluated as having a texture expressed with the term "red as wine", and 9 colors were evaluated as having a texture expressed with the term "blue as ice". The thus-obtained texture evaluation values were inputted via an operating unit so as to be stored in the recording unit 13.

(2-3) Constructing and Retraining of Neural Network

A neural network was constructed, and the training thereof was carried out in the same manner as in Example 1 (1-3). As training data, characteristic quantities and texture evaluation values of 65 paint colors which were arbitrarily selected from the selected 100 paint color samples were utilized. The selected 65 paint color samples included the 4 paint color samples that were evaluated as having a texture expressed with the term "red as wine", and 5 samples that were evaluated as having a texture expressed with the term "blue as ice".

The neural network after training was used to determine texture evaluation values for 35 paint colors that had not been utilized for the training among the selected 100 paint color samples, thereby the accuracy of the neural network after training was verified. The verification was conducted in the same manner as in Example 1 (1-3). Referring to the determined texture evaluation values, the textures of the 35 paint color samples that had not been utilized for the training were precisely predicted. Accordingly, the neural network was appropriately determined.

(2-4) Creation of Texture Database

A texture database was created in the same manner as in Example 1 (1-3).

(2-5) Search for a Paint Color with Texture

The requests of a desired texture expressed with an impression term were entered, and paint colors having the corresponding texture were searched in the database. Specifically, paint colors with a "red as wine" appearance, and paint colors with a "blue as ice" appearance were respectively searched.

First, paint colors with a "red as wine" appearance were searched, and computer graphic images of the 66 paint colors retrieved were displayed on a display apparatus. Then, the experienced designer, who also evaluated the textures of the paint color samples, evaluated the textures of the displayed paint colors. As a result, 54 paint colors out of the 66 colors retrieved were those with a "red as wine" appearance (accuracy rate: 81.8%). Subsequently, paint colors with a "blue as ice" appearance were searched and, similarly as for the "red as wine" texture, the experienced designer evaluated the computer graphic images of the 87 paint colors retrieved. As a result, 73 paint colors out of the 87 colors retrieved were those with a "blue as ice" appearance (accuracy rate: 83.9%). Accordingly, paint colors with a desired texture were retrieved from the database at a high accuracy of about 80% or more.

INDUSTRIAL APPLICABILITY

The method of creating a database for searching for a paint color, the search method using the database, and the system, the program, and the recording medium therefor according to the present invention enables the creation of a database in which the textures or the color categories of the paint colors are associated with codes each of which is specific to each paint color. Further, using the database, a set of stock colors can be narrowed down with high accuracy to a paint color that matches a desired texture, or a paint color that belongs to a desired color category.

The invention claimed is:

1. A method for creating a paint color database, comprising:
 a first step of storing spectral reflectance data and micro-brilliance data expressing particle feeling of a plurality of paint colors in a recording unit after associating each spectral reflectance data and each micro-brilliance data with a code for specifying each paint color;
 a second step of storing texture evaluation values of sample paint colors selected from the plurality of paint colors in the recording unit after associating the each texture evaluation value with the code;
 a third step of calculating characteristic quantities of the paint colors expressing textures using the spectral reflectance data and the micro-brilliance data, and storing the characteristic quantities in the recording unit after associating the each characteristic quantity with the code;
 a fourth step of carrying out a process for training a neural network having input units corresponding to the characteristic quantities and output units corresponding to the texture evaluation values, using the characteristic quantities and the texture evaluation values of the sample paint colors as training data; and
 a fifth step of inputting characteristic quantities of the paint colors other than the sample paint colors into the neural network after the training process, and storing output data in the recording unit after associating the each output data with the code.

2. The method for creating a paint color database according to claim 1,
 wherein:
 the first step comprises a step of obtaining image data of each paint color using an imaging device and calculating micro-brilliance data from the image data,
 the micro-brilliance data are HG, HB, HBL and SB,
 the HG has a condition such that:
 in cases where IPSL$\geq$0.32: HG=500·IPSL−142.5
 in cases where 0.32>IPSL$\geq$0.15: HG=102.9·IPSL−15.4
 in cases where 0.15>IPSL: HG=0
 the HB has a condition such that:

$HB=(BV-50)/2$ the HBL is an HB found from the image data taken under a condition where GL=14, and the SB is an HG found from the image data taken under a condition where GL=125,
 wherein GL represents an average gray level of image data, V and A respectively represent gross luminance volume and gross luminance area greater than a threshold="GL+32" binarized by the threshold, L represents an average particle diameter binarized by a threshold="GL+24", PHav and PSav respectively represent an average peak height and an average peak skirt of luminance image that satisfy: PHav=3V/A, PSav=L/PHav and BV=PHav+350PSav,
 IPSL satisfies:

$IPSL = \int_0^N \int_0^{2\pi} P(v,\theta)dv d\theta / P(0,0)$ wherein $v$ represents spatial frequency, $\theta$ represents angle, $P(v,\theta)$ represents power spectrum found from the image data, and 0 to N are spatial frequency regions for the particle feeling.

3. The method for creating a paint color database according to claim 1,
 wherein:
 the characteristic quantities include:
 a characteristic quantity $L^*_{15}$, a characteristic quantity $a^*_{15}$, and a characteristic quantity $b^*_{15}$, which are $L^*$ value, $a^*$ value, and $b^*$ value calculated from a spectral reflectance at an observation angle of 15° in the $L^*a^*b^*$ color space, a characteristic quantity $L^*_{45}$, a characteristic quantity $a^*_{45}$, and a characteristic quantity $b^*_{45}$, which are $L^*$ value, $a^*$ value, and $b^*$ value calculated from a spectral reflectance at an observation angle of 45° in the $L^*a^*b^*$ color space, a characteristic quantity $L^*_{75}$, a characteristic quantity $a^*_{75}$, and a characteristic quantity $b^*_{75}$, which are $L^*$ value, $a^*$ value, and $b^*$ value calculated from a spectral reflectance at an observation angle of 75° in the $L^*a^*b^*$ color space;
 a characteristic quantity FF(15,25), a characteristic quantity FF(25,45), a characteristic quantity FF(45,75), a characteristic quantity FF(75,110) and a characteristic quantity FF(15,45), which are found according to $2\times(Y_{15}-Y_{25})/(Y_{15}+Y_{25})$, $2\times(Y_{25}-Y_{45})/(Y_{25}+Y_{45})$, $2\times(Y_{45}-Y_{75})/(Y_{45}+Y_{75})$, $2\times(Y_{75}-Y_{110})/(Y_{75}+Y_{110})$, and $2\times(Y_{15}-Y_{45})/(Y_{15}+Y_{45})$, respectively, wherein $Y_{15}$ represents a Y value calculated from a spectral reflectance at an observation angle of 15° in the XYZ color space, $Y_{25}$ represents a Y value calculated from a spectral reflectance at an observation angle of 25° in the XYZ color space, $Y_{45}$ represents a Y value calculated from a spectral reflectance at an observation angle of 45° in the XYZ color space, $Y_{75}$ represents a Y value calculated from a spectral reflectance at an observation angle of 75° in the XYZ color space, $Y_{110}$ represents a Y value calculated from a spectral reflectance at an observation angle of 110° in the XYZ color space;
 a characteristic quantity $c^*_{15}$ that is a $c^*$ value calculated from a spectral reflectance at an observation angle of 15° in the $L^*C^*h^*$ color space, a characteristic quantity $c^*_{45}$ that is a $c^*$ value calculated from a spectral reflectance at an observation angle of 45° in the $L^*C^*h^*$ color space, and a characteristic quantity $c^*_{75}$ that is a $c^*$ value calculated from a spectral reflectance at an observation angle of 75° in the $L^*C^*h^*$ color space;
 a characteristic quantity cFF(15,25) that is found according to $2\times(c^*_{15}-c^*_{25})/(c^*_{15}+c^*_{25})$, a characteristic quantity cFF(25,45) that is found according to $2\times(c^*_{25}-c^*_{45})/(c^*_{25}+c^*_{45})$, a characteristic quantity cFF(45,75) that is found according to $2\times(c^*_{45}-c^*_{75})/(c^*_{45}+c^*_{75})$, a characteristic quantity cFF(75,110) that is found according to $2\times(c^*_{75}-c^*_{110})/(c^*_{75}+c^*_{110})$, and a characteristic quantity cFF(15,45) that is found according to $2\times(c^*_{15}-c^*_{45})/(c^*_{15}+c^*_{45})$, wherein $c^*_{25}$ represents a $c^*$ value calculated from a spectral reflectance at an observation angle of 25° in the $L^*C^*h^*$ color space, and $c^*_{110}$ represents a $c^*$ value calculated from a spectral reflectance at an observation angle of 110° in the $L^*C^*h^*$ color space; and
 characteristic quantities HG, HB, HBL and SB which are the micro-brilliance data.

4. A method for searching for a paint color in a paint color database created by the method for creating a paint color database according to claim 1, comprising:

a first step of receiving, as a search query, texture and an evaluation value that denotes a degree of presence of the texture;

a second step of retrieving an evaluation value corresponding to the texture from the database, and determining whether the evaluation value is a value indicating the presence of the texture; and a third step of, if determining that the evaluation value is a value indicating the presence of the texture in the second step, giving a corresponding paint color code as a search result.

5. A system for searching for a paint color in a paint color database created by the method for creating a paint color database according to claim 1, comprising:

an arithmetic unit having a recording unit storing the database, wherein:

the arithmetic unit receives, as a search query, texture and an evaluation value that denotes a degree of presence of the texture, the arithmetic unit retrieves an evaluation value corresponding to the texture from the database, and determines whether the evaluation value is a value indicating the presence of the texture; and if determining that the evaluation value is a value indicating the presence of the texture in the second step, the arithmetic unit gives a corresponding paint color code as a search result.

6. A non-transitory computer readable recording medium having stored thereon a program for searching for a paint color in a paint color database created by the method for creating a paint color database according to claim 1, by causing a computer to perform:

a first function of receiving, as a search query, texture and an evaluation value that denotes a degree of presence of the texture;

a second function of retrieving an evaluation value corresponding to the texture from the database, and determining whether the evaluation value is a value indicating the presence of the texture; and a third function of, if determining that the evaluation value is a value indicating the presence of the texture in the second step, giving a corresponding paint color code as a search result.

7. A system for creating a paint color database, comprising:
an arithmetic unit having a recording unit;
a spectrophotometer; and
an imaging device,
wherein:
the arithmetic unit measures spectral reflectance data for each of a plurality of paint colors using the spectrophotometer, the arithmetic unit obtains image data of the paint colors using the imaging device, and calculates micro-brilliance data expressing particle feeling of the paint colors from the image data, the arithmetic unit stores the spectral reflectance data and the micro-brilliance data of the paint colors in the recording unit after associating each spectral reflectance data and each micro-brilliance data with a code for specifying each paint color, the arithmetic unit stores texture evaluation values of sample paint colors selected from the paint colors in the recording unit after associating the each texture evaluation value with the code, the arithmetic unit calculates characteristic quantities of the paint colors expressing textures using the spectral reflectance data and the micro-brilliance data, and stores the characteristic quantities in the recording unit after associating the each characteristic quantity with the code, the arithmetic unit carries out a process for training a neural network having input units corresponding to the characteristic quantities and output units corresponding to the texture evaluation values, using the characteristic quantities and the texture evaluation values of the sample paint colors as training data; and the arithmetic unit inputs characteristic quantities of the paint colors other than the sample paint colors into the neural network after the training process, and stores output data in the recording unit after associating the each output data with the code.

8. A non-transitory computer readable recording medium having stored thereon a program for creating a paint color database by causing a computer to realize:

a first function for storing spectral reflectance data and micro-brilliance data expressing particle feeling of a plurality of paint colors in a recording unit after associating each spectral reflectance data and each micro-brilliance data with a code for specifying each paint color;

a second function for storing texture evaluation values of sample paint colors selected from the plurality of paint colors in the recording unit after associating the each texture evaluation value with the code;

a third function for calculating characteristic quantities of the paint colors expressing textures using the spectral reflectance data and the micro-brilliance data, and storing the characteristic quantities in the recording unit after associating the each characteristic quantity with the code;

a fourth function for carrying out a process for training a neural network having input units corresponding to the characteristic quantities and output units corresponding to the texture evaluation values, using the characteristic quantities and the texture evaluation values of the sample paint colors as training data; and a fifth function for inputting characteristic quantities of the paint colors other than the sample paint colors into the neural network after the training process, and storing output data in the recording unit after associating the each output data with the code.

* * * * *